United States Patent [19]
Noguchi et al.

[11] Patent Number: 5,455,430
[45] Date of Patent: Oct. 3, 1995

[54] PHOTOVOLTAIC DEVICE HAVING A SEMICONDUCTOR GRADE SILICON LAYER FORMED ON A METALLURGICAL GRADE SUBSTRATE

[75] Inventors: Shigeru Noguchi, Hirakata; Hiroshi Iwata, Neyagawa; Keiichi Sano, Takatuki, all of Japan

[73] Assignee: Sanyo Electric Co., Ltd., Osaka, Japan

[21] Appl. No.: 922,579

[22] Filed: Jul. 30, 1992

[30] Foreign Application Priority Data

| Aug. 1, 1991 | [JP] | Japan | 3-216202 |
| Aug. 1, 1991 | [JP] | Japan | 3-216203 |
| Aug. 21, 1991 | [JP] | Japan | 3-209308 |

[51] Int. Cl.⁶ .......... H01L 29/04; H01L 27/14; H01L 31/00
[52] U.S. Cl. .......... 257/53; 257/51; 257/431; 257/461; 257/462; 257/52; 136/258
[58] Field of Search .......... 257/189, 578, 257/607, 684, 431, 461, 462, 746, 52, 51, 53, 465, 466; 156/659.1, 625; 437/195; 136/258 PC, 261, 258 AM

[56] References Cited

U.S. PATENT DOCUMENTS

| 3,961,997 | 6/1976 | Chu | 136/89 |
| 4,167,015 | 9/1979 | Hanak | 357/16 |
| 4,383,268 | 5/1983 | Martinelli et al. | 357/34 |
| 4,492,810 | 1/1985 | Ovshinsky et al. | 136/255 |
| 4,818,337 | 4/1989 | Barnett et al. | 156/659.1 |
| 5,120,679 | 6/1992 | Boardman et al. | 437/195 |
| 5,165,548 | 11/1992 | Dumler et al. | 209/2 |
| 5,198,071 | 3/1993 | Scudder et al. | 156/625 |

FOREIGN PATENT DOCUMENTS

| 54-000776 | 10/1979 | Japan | 257/53 |
| 57-192087 | 11/1982 | Japan | 257/53 |
| 59-195879 | 11/1984 | Japan | 257/766 |
| 62-063419 | 3/1987 | Japan . | |
| 02216876 | 8/1990 | Japan | 257/465 |

Primary Examiner—Rolf Hille
Assistant Examiner—T. M. Arroyo
Attorney, Agent, or Firm—Spensley Horn Jubas & Lubitz

[57] ABSTRACT

The disclosure relates to a semiconductor device comprising silicon having a substrate composed of low grade silicon, a silicon layer whose silicon purity is higher than that of the low grade silicon formed on the substrate and an electrode formed on the silicon layer. In the device, the low grade silicon may be selected from metallurgical grade silicon and silicon whose purity is less than 99.99%, and the silicon layer may be over 99.999% purity or semiconductor grade.

11 Claims, 6 Drawing Sheets

PHOTOVOLTAIC DEVICE HAVING A SEMICONDUCTOR GRADE SILICON LAYER FORMED ON A METALLURGICAL GRADE SUBSTRATE

BACKGROUND OF THE INVENTION

1. Field of the Invention

This invention relates to semiconductor devices for transistors using silicon and to a method for manufacturing such devices.

2. Description of the Prior Art

Silicon whose purity is about 99,999% is used for photovoltaic devices (also known as solar cells) and also for transistors using semiconductor grade silicon.

For example, as to photovoltaic devices using semiconductor grade silicon, first, metallurgical grade silicon is prepared by reduction of ores such as silica sand. Then, a gas of the silane groups, such as monosilane, dichlorosilane and trichlorosilane, is made from such metallurgical grade silicon. Then, using these gases, a polycrystralline silicon or amorphous silicon (a-Si) which is semiconductor grade is produced.

To produce the above mentioned semiconductor grade silicon, additional refining treatments are needed from metallurgical grade silicon. These additional treatments increase the cost of the end product.

Indeed, when high purity silicon whose purity is over 99.99% is produced, the manufacturing costs drastically increase. Thus, the development of semiconductor devices using silicon whose purity is less than 99.99% is required.

In addition, prior art semiconductor devices such as photovoltaic devices, have p-n junctions produced by diffusion methods onto the wafer surface of high purity silicon whose purity is over 99.999%. As a result, the cost of raw materials is a large component of the manufacturing cost.

In addition to high costs, generally, the part of the device where the photovoltaic (photosensitive) function takes place is very near the wafer surface. Therefore, most of the wafer is merely used as a supporting substrate thus wasting material. Photovoltaic devices using such wafers are described in Bulletin of the Electrotechnical Laboratory, Vol.51, No.5,6 p378, 1987.

SUMMARY OF THE INVENTION

Accordingly, to solve the above mentioned problems, a primary object of the present invention is to provide a low cost semiconductor device and a manufacturing method for producing such a device.

Another object of present invention is to provide a low cost semiconductor device having particularly high quality and other superior characteristics.

Still another object of the present invention is to provide a low cost and high quality photovoltaic device and a manufacturing method for producing such a device.

Still another object of the present invention is to provide a photovoltaic device without reductions of its characteristics.

The above objects are fulfilled by a semiconductor device comprising silicon having a substrate composed of metallurgical grade silicon, a silicon layer whose silicon purity is higher than that of said metallurgical grade silicon formed on said substrate and an electrode formed on said silicon layer.

The silicon substrate may be selected from the group of metallurgical grade silicon and silicon whose purity is less than 99.99%, and the silicon layer may be over 99.999% purity or semiconductor grade.

The above objects are also fulfilled by a semiconductor device comprising silicon having a substrate selected from the group of metallurgical grade silicon and silicon whose purity is less than 99.99%, a silicon layer whose silicon purity is over 99.999% formed on said substrate and an electrode formed on said silicon layer.

Further, the above objects are fulfilled by a semiconductor device comprising silicon having a substrate selected from the group of metallurgical grade silicon and silicon whose purity is less than 99.99%, a silicon layer of semiconductor grade formed on said substrate and an electrode formed on said silicon layer.

The above objects are also fulfilled by a method of manufacturing a semiconductor device comprising silicon including the three steps of preparing a substrate composed of metallurgical grade silicon; forming a silicon layer whose silicon purity is higher than that of said metallurgical grade silicon onto said substrate; and forming an electrode onto said silicon layer.

The silicon substrate may be selected from the group of metallurgical grade silicon and silicon whose purity is less than 99.99%, and the silicon layer may be over 99.999% purity or semiconductor grade.

In the manufacturing method, the silicon layer may be formed by epitaxial growth at low temperature.

Further, between said second step and said third step, an opposite conductive type of a-Si compared to said silicon layer may be formed onto said silicon layer.

In the manufacturing method, the second step may comprise the following processes: hydrogen is diffused from a surface of said substrate prepared by said first step under a high pressure condition, and impurities are removed from said surface of said substrate.

In the manufacturing method, the second step may also comprise the following processes: a first process of bringing said substrate into contact with molten tin (Sn); a second process of irradiating said substrate using an energy beam; and a third process of dissolving impurities of said substrate in said molten tin (Sn) to produce a silicon layer.

Further, the above objects are fulfilled by a method of manufacturing a photovoltaic semiconductor device comprising silicon including the following four steps: preparing a substrate composed of metallurgical grade silicon; forming an active silicon layer whose silicon purity is higher than that of said metallurgical grade silicon onto said substrate; forming one conductive type of a-Si layer onto one portion of said active silicon layer; and forming another conductive type of a-Si layer onto another portion of said active silicon layer.

In the method, the process temperature of both the third step and the fourth step may be lower than that of the second step.

Further, the above objects are fulfilled by a photovoltaic semiconductor device comprising silicon having an active silicon layer formed on a substrate composed of low grade silicon whose silicon purity is comparatively lower than that of said active silicon layer, one conductive type of a-Si on one portion of said silicon layer and another conductive type of a-Si formed on another portion of said active silicon layer.

The substrate may be selected from the group of metallurgical grade silicon and silicon whose purity is less than 99.99%, and the silicon layer may be over 99.999% purity or semiconductor grade.

Further, the above objects are also fulfilled by a method of manufacturing a semiconductor device comprising silicon including the steps of preparing raw materials composed of low grade silicon; fusing said raw materials prepared by the first step; segregating impurities of said raw materials using a force during said second step; removing said impurities from said raw materials to obtain a high purity silicon; and forming an electrode onto said high purity silicon.

The force may be selected from the group of centrifugal force, magnetic force and gravity.

Where centrifugal force is selected, hydrogen gas may be directed towards the fused raw materials from a fixed point.

The foregoing objects are fulfilled by the above structures and methods for the following reasons.

Metallurgical grade silicon and low purity silicon are made by reduction of ores. The energy of refining the metallurgical grade silicon and the low purity silicon is as low as that of refining aluminum (Al) or titanium (Ti). Thus, it is easy to provide a silicon substrate which is low cost and which has a large area. Despite its low cost, the silicon substrate has necessary characteristics of a silicon semiconductor, and it is easy to form high purity silicon onto the silicon substrate. Therefore, using the high purity silicon which acts as an active layer formed onto the silicon substrate, low cost semiconductor devices can be obtained.

In a photovoltaic device according to the present invention, in the case of incoming light, most of the photogenerated carriers are generated within the high purity silicon layer which acts as the active (photosensitive) layer and the photogenerated carriers are removed through the electrodes.

Moreover, according to the manufacturing methods of the invention, the process temperature for the subsequent processes (producing the conductive a-Si) can be set lower than that for forming the high purity silicon layer. As a result, during manufacturing, the diffusion of impurities from the low purity silicon substrate into the high purity silicon layer is prevented and photovoltaic devices with excellent characteristics are obtained.

BRIEF DESCRIPTION OF THE DRAWINGS

These and other objects, advantages and features of the invention will become apparent from the following description thereof taken in conjunction with the accompanying drawings which illustrate specific embodiments of the invention. In the drawings.

DETAILED DESCRIPTION OF THE PREFERRED EMBODIMENT

FIRST EMBODIMENT

First, a low purity silicon substrate whose silicon purity is in the range form 98% to 99.99% is prepared.

For this purpose, metallurgical grade silicon, produced by reduction of an ore such as silica sand, is used. For example, metallurgical grade silicon is produced by reduction in accordance with reaction [1] after heating a mixture of crystalline silica sand, which mainly comprises quartz mixed with coal or coke in a large scale arc furnace.

$$SiO_2 + 2C \rightarrow Si + 2CO \qquad [1]$$

Next, fused silicon is extracted from the furnace periodically and solidified in a mold to produce silicon blocks. The silicon blocks include impurities and impurity concentrations as shown in TABLE1.

TABLE 1

| Impurities (element) | Impurity Concentration (ppm atomic) |
|---|---|
| Aluminum (Al) | 1,500–4,000 |
| Boron (B) | 40–80 |
| Chromium (Cr) | 50–200 |
| Iron (Fe) | 2,000–3,000 |
| Manganese (Mn) | 70–100 |
| Nickel (Ni) | 30–90 |
| Phosphorus (P) | 20–50 |
| Titanium (Ti) | 160–250 |

TABLE 1-continued

| Impurities (element) | Impurity Concentration (ppm atomic) |
| --- | --- |
| Vanadium (V) | 80–200 |

The purity of the above metallurgical grade silicon is less than 99.6% as shown in TABLE1.

Secondly, the semiconductor device for the photovoltaic device using the above silicon will now be described.

Figure 1:
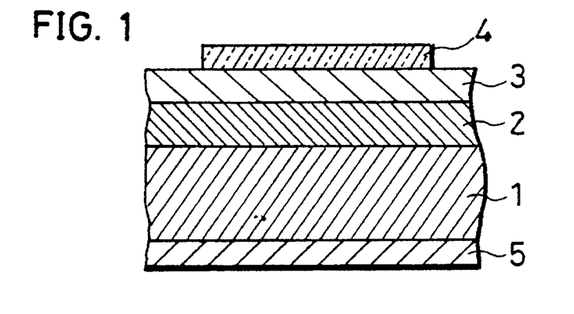
FIG. 1 is a side elevation view, in cross section, of a photovoltaic device in accordance with the present invention.

FIG. 1 is an illustration of the photovoltaic device in accordance with the present invention.

In FIG. 1, a substrate is shown as 1, which is metallurgical grade silicon whose purity is 98% and whose thickness is 300 μm.

On the substrate 1, a $n^-$-type polycrystalline silicon layer 2 is formed by epitaxial growth method in low temperature, such as photo-CVD, spontaneous chemical deposition and plasma CVD. On the polycrystalline silicon layer 2 there is formed a p-type a-Si layer 3 or a complex a-Si layer which consists of i-type silicon layer and p-type silicon layer. Additionally, a transparent electrode 4 is formed on the a-Si layer 3, and a back electrode 5 is formed on a back surface of the substrate 1 to complete the photovoltaic device.

The $n^-$-type polycrystalline silicon layer 2 is formed on the substrate 1 by plasma CVD and the $p^+$-type a-Si layer 3 in accordance with the following conditions.

First process of forming the $n^-$-type polycrystalline silicon layer 2:

Thickness of layer 2: 5 μm.

$SiH_4$ gas: 5 sccm $SiH_2F_2$ gas: 5 sccm $H_2$ gas (dilute gas) : 100 sccm $PH_3$ (0.1%)/$H_2$ gas: 1 sccm Substrate temperature: 300° C.

RF power: 10 W

Pressure: 100 mTorr

Second process of forming the $p^+$-type a-Si layer 3 on the $n^-$-type polycrystalline silicon layer 2 by plasma CVD;

Thickness of layer 3: 100 Å

$SiH_4$ gas: 5 sccm $H_2$ gas (dilute gas) : 10 sccm $B_2H_6$(1%)/$H_2$ gas: 5 sccm Substrate temperature: 150° C.

RF power: 10 W

Pressure: 100 mTorr

After forming the $n^-$-type polycrystalline silicon layer 2 and the $p^+$-type a-Si layer 3, the back electrode 5 with 5000 Å thickness is formed onto the back surface of the substrate 1 directly by evaporation of aluminum (Al) for the high resistance of metallurgical grade silicon. A transparent electrode layer 4 consisting of ITO is formed onto the $p^+$-type a-Si layer 3 by sputtering to complete the photovoltaic device.

Inserting a non-doped a-Si layer with approximately 80 Å thickness between the $p^+$-type a-Si layer 3 and the $n^-$-type polycrystalline silicon layer 2, improves the characteristics of the photovoltaic device.

In this way, the semiconductor layer comprising the polycrystalline silicon is formed onto the substrate 1 by epitaxial growth under low temperature. Therefore, impurities do not diffuse into the active layer from the metallurgical grade silicon, thus preserving the characteristics of the device.

By setting the process temperature below 600° C. during manufacturing, diffusion of impurities from the substrate 1 is prevented.

Accordingly, photo-CVD or CVD using $F_2$ gas, besides plasma CVD, can be used in this embodiment. Also, crystallization of a-Si by thermal annealing at less than 600° C. (called solid phase crystallization) is available for this invention.

SECOND EMBODIMENT

Figure 2:
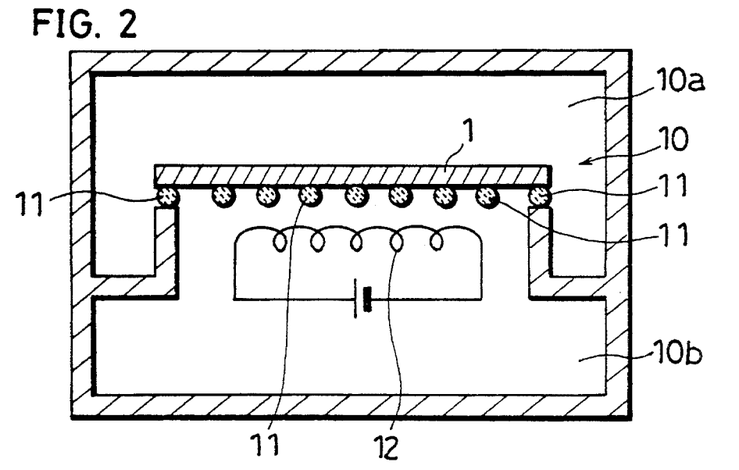
FIG. 2 is a side elevation view, in cross section, of a manufacturing apparatus in accordance with the present invention.

EMBODIMENT2 of the present invention is described with reference to FIG. 2.

The metallurgical grade silicon substrate 1 with 98% silicon purity and 1 mm thickness is set in a vacuum furnace 10. The substrate 1 is placed on supports 11 which are arranged at 1 mm intervals for enduring high pressure. The substrate 1 is heated in the range from 200° C. to 1300° C. by the heater 12 provided below the supports 11. In this embodiment, the substrate 1 is heated at 700° C. In this state, a high pressure hydrogen gas at approximately 100 atm is supplied to the upper part of the vacuum furnace 10. The lower part 10b of the vacuum furnace 10 is maintained at low pressure or vacuum.

After the hydrogen gas is diffused into the substrate 1 under high pressure, the impurities of the substrate 1 surface are removed, and also the termination of the defect is completed. As a result, an active layer which is high purity silicon is formed on the substrate 1. For example, by diffusing the hydrogen gas at 100 atm and 700° C. for 10 minutes under a high pressure condition, an active layer comprising high purity silicon having a 10 μm thickness is formed.

After n-type impurities such as phosphorus (P) are doped into the active layer and, as a result, a $n^-$-type semiconductor layer is formed, a $p^+$-type a-Si layer is formed by plasma CVD. After forming a transparent electrode layer and a back electrode, the photovoltaic device is provided.

THIRD EMBODIMENT

Figure 3:
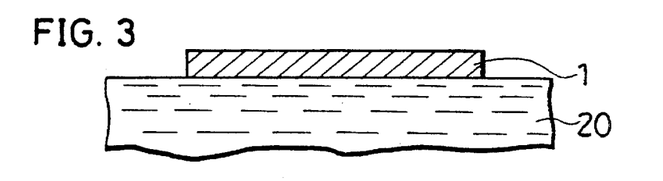
FIG. 3 is a side elevation view, in cross section, of a manufacturing apparatus in accordance with another embodiment of the present invention.

FIG. 3 is a schematic sectional view of a manufacturing apparatus in accordance with a third embodiment of the present invention.

A metallurgical grade silicon substrate 1 with 98% silicon purity and 1 mm thickness is placed on the surface of molten tin (Sn) 20 which is heated at 700° C. An Eximer laser light of 100 mJ/cm²-100 Hz power is irradiated on the substrate 1. By such irradiation, the impurities in the substrate 1 are transferred to the molten tin (Sn) 20. As a result, an active layer comprising high purity silicon is formed on the substrate 1 surface contacting the molten tin (Sn) 20. In the same way as the second embodiment, after the active layer is doped by impurities, such as phosphorus (P), to form a $n^-$-type semiconductor layer, a $p^+$-type a-Si layer is formed by plasma CVD. Finally, a transparent electrode and a back electrode are formed to complete the photovoltalc device.

Although the first, second and third embodiments are directed to photovoltaic devices, the invention may be used for other semiconductor devices such as integrated circuits consisting mainly of switching-transistors.

In this way, in accordance with the first, second and third embodiments, a high purity silicon layer may be readily formed on a low cost substrate comprising metallurgical grade silicon. Therefore, using the high purity silicon layer which act as an active layer, low cost semiconductor devices can be obtained.

FOURTH EMBODIMENT

The fourth embodiment of the present invention will be described with reference to FIG. 4.

Figure 4:
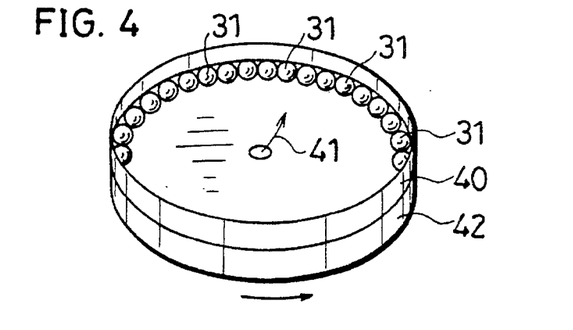
FIG. 4 is a perspective view of a manufacturing apparatus in accordance with yet another embodiment of the present invention.

FIG. 4 is a perspective illustration of a manufacturing apparatus in accordance with the present invention. Low purity silicon grains 31 whose silicon purity is in the range from 98% to 99.99% with less than 1 mm diameter are prepared. The silicon grains 31 are put on a rotator 40.

From the center (a fixed point) of the rotator 40, nitrogen ($N_2$) or argon (Ar) gas 41 is discharged. The heater 42 is mounted under the rotator 40. By means of the heater 42, the silicon grains 31 on the rotator 40 are heated in the range of from 1000° C. to 1300° C. In this heated atmosphere, the rotator 40 is turned at more than 30,000 rpm. As a result of this rotation, heavy metals such as iron (Fe), copper (Cu) and nickel (Ni) are removed from the silicon grains 31, and high purity silicon grains are obtained.

Figure 5:
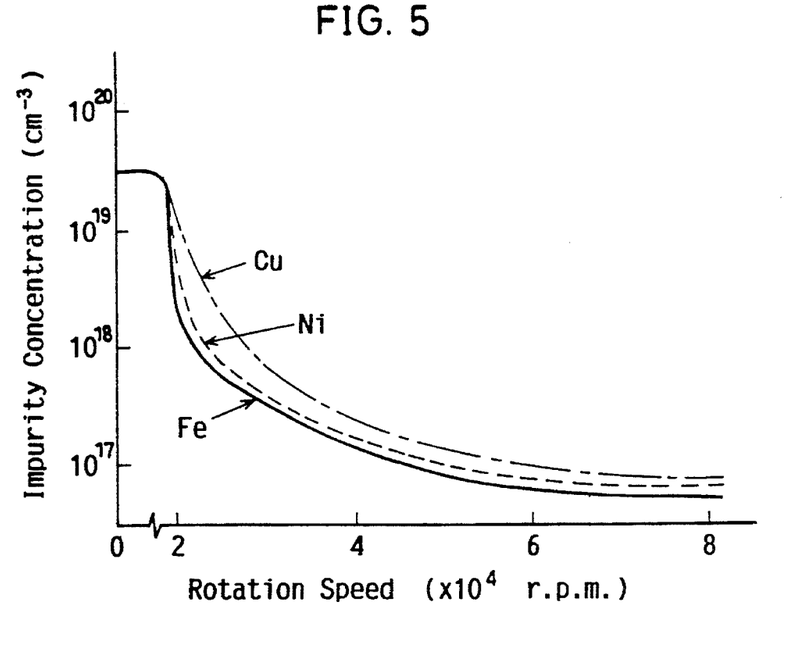
FIG. 5 is a graph showing the relationship between rotational speed of a rotator and impurity concentration in the silicon grains in accordance with the embodiment of FIG. 4.

FIG. 5 is a graph showing the relationship between the rotational speed of the rotator 40 and the impurity concentrations of heavy metals such as iron (Fe), copper (Cu) and nickel (Ni) in the silicon grains 31. According to FIG. 5, as the rotational speed is increased, more impurities of silicon grains 31 are removed.

Figure 6:
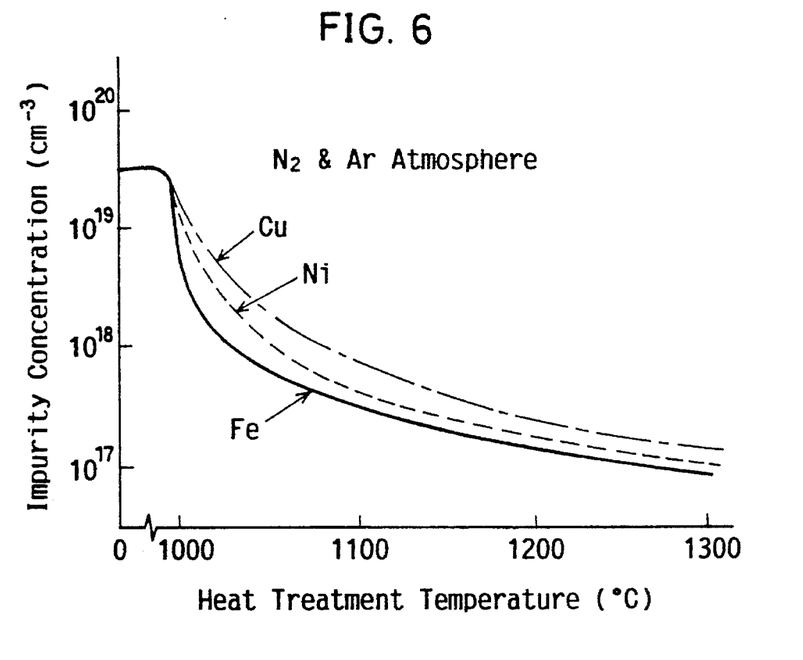
FIG. 6 is a graph showing the relationship between heat treatment temperature using an atmosphere of nitrogen and argon and impurity concentration in the silicon grains in accordance with the embodiment of FIG. 4.

FIG. 6 is a graph showing the relationship between heat treatment temperature with rotational speed at 30,000 rpm and with an atmosphere consisting of nitrogen and argon gas, and impurity concentration in the silicon grains. According to FIG. 6, as the heat treatment temperature is raised, more impurities in silicon grains are removed.

Figure 7:
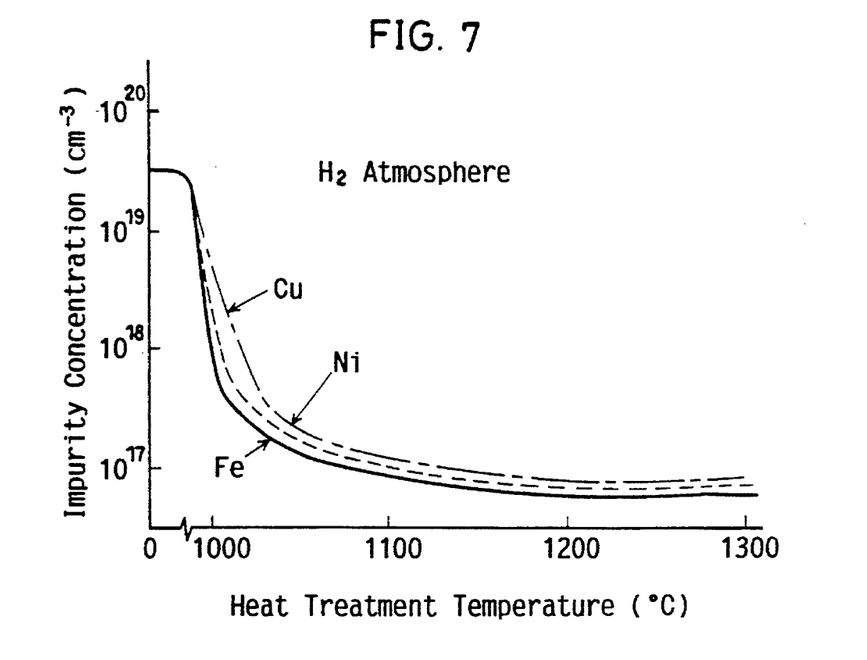
FIG. 7 is a graph showing the relationship between heat treatment temperature using a hydrogen atmosphere and impurity concentration in the silicon grains in accordance with the embodiment of FIG. 4.

FIG. 7 is a graph showing the relationship between heat treatment temperature with rotational speed at 30,000 rpm and a hydrogen atmosphere, and impurity concentration in the silicon grains. According to FIG. 7, as the heat treatment temperature is raised, more impurities of silicon grains are removed. Additionally, it is more advantageous to use hydrogen gas than to use nitrogen gas or argon gas to remove impurities from silicon grains.

Figure 8:
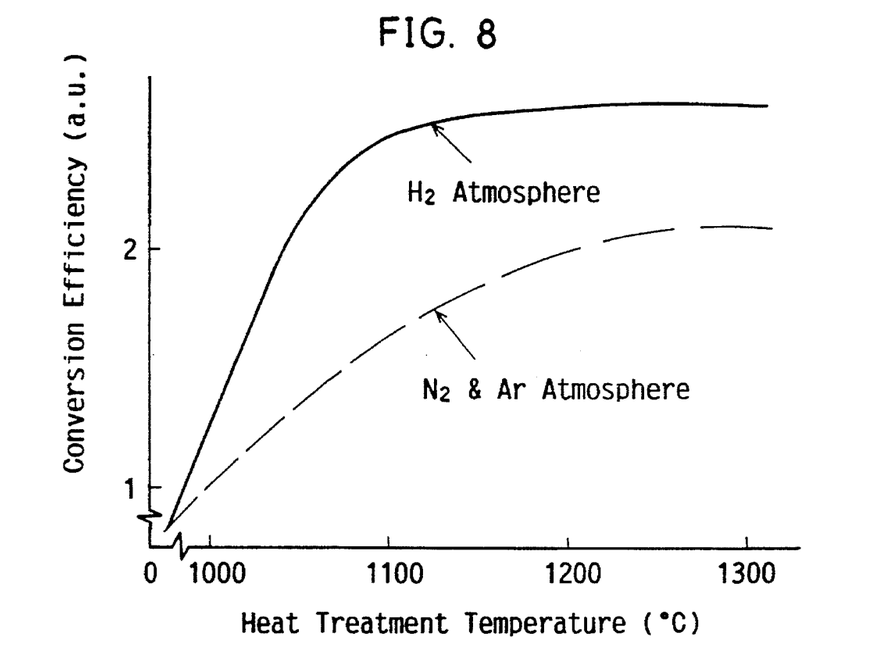
FIG. 8 is a graph showing the relationship between heat treatment temperature and conversion efficiency of the photovoltaic device in accordance with the embodiment of FIG. 4, FIG. 9 and FIG. 10 are illustrations showing a process in accordance with a fifth embodiment of the present invention.

After preparing the silicon grains, the p-n junction is formed on the surface of the silicon grains. FIG. 8 is a graph showing the relationship between heat treatment temperature and conversion efficiency of the photovoltaic device. According to FIG. 8, as to conversion efficiency of the photovoltaic device, it is more advantageous to use hydrogen gas than to use nitrogen gas or argon gas.

FIFTH EMBODIMENT

Figure 9:
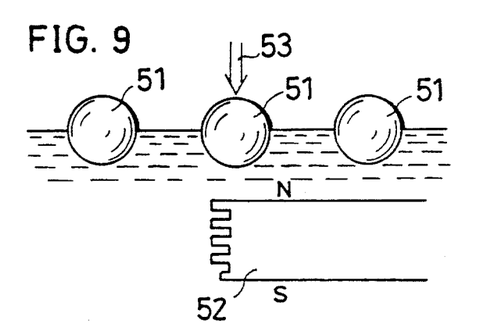

The fifth embodiment will be described with reference to FIG. 9 and FIG. 10.

In the same way as the fourth embodiment, silicon grains 51 with 1 mm diameter whose silicon purity is in the range from 99% to 99.99% are prepared. The silicon grains 51 are placed in a magnetic field in the range from $1\times10^3$ Gauss to $1\times10^6$ Gauss by the coil 52 as shown in FIG. 9, and the silicon grains 51 are irradiated by a greater than 200 mJ/cm$^2$ Eximer laser light 53 whose diameter is set in the same diameter of the silicon grains 51 to melt the silicon grains 51. In this way, the impurities such as iron (Fe) in the silicon grains 51 are segregated downward by gravity and the magnetic force generated by the magnetic field.

Figure 10:
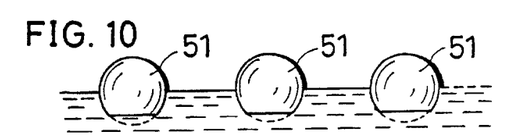

As shown in FIG. 10, the lower part of the silicon grains 51 where the impurities are gathered is removed by etching to manufacture the high purity silicon.

SIXTH EMBODIMENT

Figure 11:
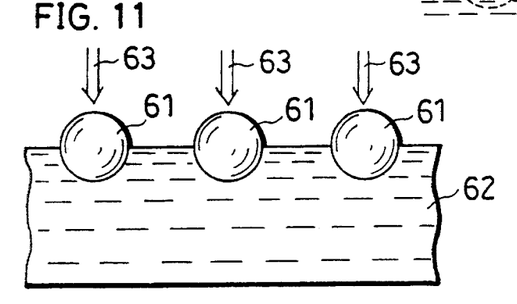
FIG. 11 is an illustration of a process in accordance with a sixth embodiment of the present invention.

The sixth embodiment will be described with reference to FIG. 11.

Low purity silicon grains 61 whose silicon purity is in the range from 99% to 99.99% are floated on molten tin (Sn) 62 which is heated at 700° C. In this state, the silicon grains 61 are irradiated by Eximer laser light 63. As the result of this irradiation, the impurities in the silicon grains 61 dissolve in the molten tin (Sn) 62.

In this way, high purity silicon is obtained.

SEVENTH EMBODIMENT

The seventh embodiment will be described with reference to FIG. 12 and FIG. 13.

First, the plasma spray apparatus will be described. In FIG. 12, 71 is a vacuum chamber and 72 is a DC power supply for the plasma spray apparatus. The DC power supply 72 is connected to a cathode electrode 74a and to an anode electrode 74b composed of a plasma spray gun 73. 75 is an inlet of raw materials powder for semiconductor materials such as small scalelike pieces of silicon whose size is in the range from 300 μm to 400 μm. The raw materials powder is fused by DC plasma heat, which is generated between the cathode electrode 74a and the anode electrode 74b. 76 is a spray gas inlet for introducing a spray gas such as helium (He), argon (Ar) or hydrogen ($H_2$). The fused raw materials are sprayed from the plasma spray gun 73 as fine powder of plasma jet 77. By the plasma jet 77, a globular form of silicon is formed in accordance with the raw materials powder at the opposite side of the plasma spray gun 73. 80a is a gas inlet to introduce atmosphere gas, and 80b is a gas outlet to exhaust the atmosphere.

In the seventh embodiment, using the above mentioned plasma spray apparatus, the impurities are removed from the scalelike pieces of silicon comprising low purity silicon, and silicon grains with globular form whose diameter is in the range from 300 μm to 400 μm are manufactured. During this manufacturing process, a p-n junction is formed at the same time.

After the vacuum chamber 71 is exhausted and the pressure set in the range of from 100 Torr to 400 Torr, plasma jet gas such as argon gas (Ar) is introduced at a flow rate ranging of from 0.5 SLM to 20 SLM from the spray gas inlet 76. From the inlet of powder 75, the raw materials for plasma spray of granulated metallurgical grade silicon such as p-type silicon powder whose diameter is less than 10 μm and whose shape is small scalelike piece are introduced at a rate of from 1 g/min to 20 g/min.

Electric power is supplied by the DC power supply 72 in the range of from 10 KW to 50 KW, and plasma jet 77 is generated. The temperature of the plasma torch exit reaches 10,000° K., and the silicon is fused. Upon fusion of the silicon, the impurities in the silicon are segregated and evaporate thereby increasing the silicon purity. As a result, high purity silicon is solidified to form the silicon grains. During the solidification process, as shown in FIG. 13, an n-type dopant is used as the plasma jet, carrier gas or spray atmosphere gas and the n-type impurities are diffused on the surface of the silicon grains to form the p-n junction.

Secondly, the small scalelike pieces of p-type silicon powder are formed into silicon grains having diameters ranging from 300 μm to 400 μm, and the n-type impurities are diffused with 5 μm thickness on the surface of the silicon grains in each embodiment. These conditions are described in TABLE2 to TABLE5.

Figure 12:
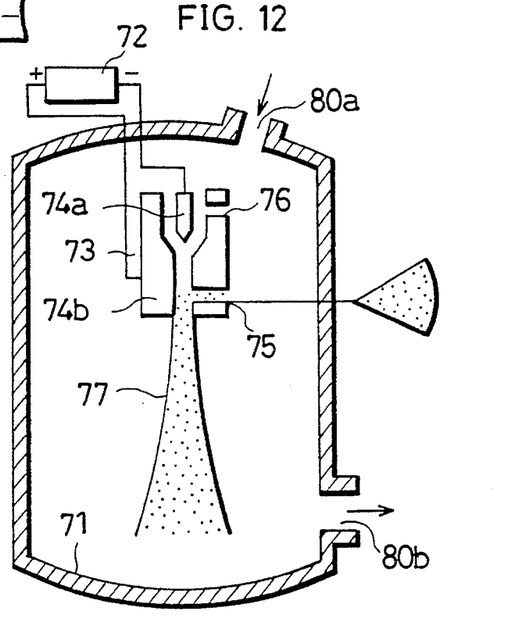
FIG. 12 is a side elevation view in section showing a plasma apparatus used in a seventh embodiment of the present invention.
Figure 13:
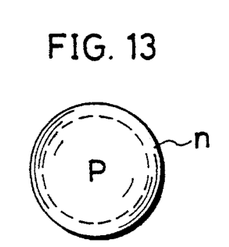
FIG. 13 is an illustration of a silicon grain made by the process of the seventh embodiment of the present invention.

The following TABLE2 to TABLE4 show the conditions on the plasma spray under reduced pressure using the plasma spray apparatus shown in FIG. 12. TABLE5 shows the conditions on the plasma spray using an autoclave as a chamber.

TABLE 2

| plasma gas | 10% PH$_3$/H$_2$ | 1 SLM–50 SLM | 20 SLM–40 SLM |
|---|---|---|---|
|  | H$_2$ | — | — |
|  | Ar | 0.5–20 SLM | 9–18 SLM |
| carrier gas | 10% PH$_3$/H$_2$ | — | — |
|  | H$_2$ | 1–10 SLM | — |
| atmosphere gas | 10% PH$_3$/H$_2$ | — | — |
|  | H$_2$ | 1–10 SLM | — |
| DC power |  | 10–50 KW | 30–40 KW |
| pressure |  | 100–400 Torr | 200–300 Torr |
| the amount of supplying powder |  | 1–20 g/min | 2–5 g/min |

In TABLE2, n-type dopant (PH$_3$) is included in the plasma gas, and the right hand values are the more preferable values.

TABLE 3

| plasma gas | 10% PH$_3$/H$_2$ | — | |
|---|---|---|---|
|  | H$_2$ | 1–50 SLM | |
|  | Ar | 0.5–20 SLM | |
| carrier gas | 10% PH$_3$/H$_2$ | 1–50 SLM | 20–40 SLM |
|  | H$_2$ | 1–10 SLM | |
| atmosphere gas | 10% PH$_3$/H$_2$ | — | — |
|  | H$_2$ | 1–10 SLM | |
| DC power |  | 10–50 KW | 30–40 KW |
| pressure |  | 100–400 Torr | 200–300 Torr |
| the amount of supplying powder |  | 1–20 g/min | 2–5 g/min |

In TABLE3, n-type dopant (PH$_3$) is included in the carrier gas, and the right hand values are the more preferable values.

TABLE 4

| plasma gas | 10% PH$_3$/H$_2$ | — | |
|---|---|---|---|
|  | H$_2$ | 1–50 SLM | |
|  | Ar | 0.5–20 SLM | |
| carrier gas | 10% PH$_3$/H$_2$ | — | |
|  | H$_2$ | 1–10 SLM | |
| atmosphere gas | 10% PH$_3$/H$_2$ | 1–70 SLM | 30–50 SLM |
|  | H$_2$ | 1–10 SLM | |
| DC power |  | 10–50 KW | 30–40 KW |
| pressure |  | 100–400 Torr | 200–400 Torr |
| the amount of supplying powder |  | 1–20 g/min | 2–5 g/min |

In TABLE4, n-type dopant (PH$_3$) is included in the atmosphere gas, and the right hand values are the more preferable values.

TABLE 5

| plasma gas | 10% PH$_3$/H$_2$ | 1–50 SLM | 20–40 SLM |
|---|---|---|---|
|  | H$_2$ | — | — |
|  | Ar | 0.5–20 SLM | 9–18 SLM |
| carrier gas | 10% PH$_3$/H$_2$ | — | — |
|  | H$_2$ | 1–10 SLM | — |
| atmosphere gas | 10% PH$_3$/H$_2$ | — | — |
|  | H$_2$ | 1–10 SLM | — |
| DC power |  | 10–50 KW | 30–40 KW |
| pressure |  | 100–400 Torr | 80–90 Kgf/cm$^2$ |
| the amount of supplying powder |  | 1–20 g/min | 2–5 g/min |

In TABLE5, n-type dopant (PH$_3$) is included in the plasma gas, and the right hand values are the more preferable values.

In the case of plasma spray under reduced pressure, the effect of the hydrogen gas is to increase the silicon purity under the reducing atmosphere. Additionally, in the case of the pressured plasma spray, it has the effect of terminating the dangling bonds.

As to n-type dopant, AsH$_3$/H$_2$ or POCl$_3$ is available as well as above mentioned PH$_3$.

In the above embodiment, the n-type impurities are diffused into the p-type powder; however, the p-type impurities are able to diffuse into the n-type powder. In this case, B$_2$H$_6$/H$_2$ or B(CH$_3$)$_3$/H$_2$ may be used as the dopant gas.

The characteristics of the silicon obtained by the above embodiment are shown in TABLE6.

TABLE 6

| raw materials | purity (%) | donor concentration (cm$^{-3}$) | acceptor concentration (cm$^{-3}$) |
|---|---|---|---|
| p-type powder | 99.99 | 1 × 10$^{17}$–1 × 10$^{20}$ surface layer | 1 × 10$^{18}$–1 × 10$^{21}$ in the bulk |
| n-type powder | 99.99 | 1 × 10$^{18}$–1 × 10$^{21}$ in the bulk | 1 × 10$^{17}$–1 × 10$^{20}$ surface layer |

In this way, in the fourth through the seventh embodiments, the following may be recognized:

In the fourth embodiment, since heavy metals in the silicon semiconductor are removed by centrifugal force, the silicon is thereby refined and high purity silicon obtained.

In the fifth embodiment, the impurities of heavy metals in the silicon semiconductor material are segregated in the lower part by magnetic force and gravity. The part where the impurities are gathered is removed, thereby refining the silicon and providing high purity silicon.

Additionally, according to the sixth embodiment, the impurities of heavy metals in the silicon semiconductor material are dissolved in the molten tin (Sn), and the impurities are removed, thereby refining the silicon and providing high purity silicon.

Last according to the seventh embodiment, the small scalelike pieces of silicon are changed into the globular form of silicon, and at the same time a p-n junction can be formed.

EIGHTH EMBODIMENT

The eighth embodiment will be described with reference to FIG. 14.

Figure 14A:
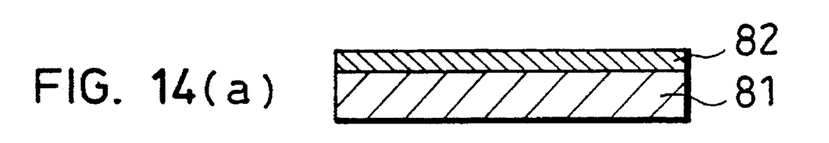
FIG. 14(a)–(f) are side elevation views, in cross section, showing the stages of manufacture of a device in accordance with an eighth embodiment of the present invention.

FIG. 14a shows a state in which a high purity silicon layer 82 is formed on a low purity silicon substrate 81 by epitaxial growth. As to the low purity silicon substrate 81, in this embodiment a metallurgical grade silicon substrate with 98% silicon purity and 300 μm thickness is used. As to the epitaxial growth, photo-CVD, spontaneous chemical deposition and plasma CVD can be used: in this embodiment, plasma CVD is used.

Typical conditions for forming the layer are:

First, the high purity silicon layer 82 is formed onto the metallurgical grade silicon substrate 81;

Substrate: set in the plasma CVD apparatus $SiH_4$ gas: 5 sccm $SiH_2F_2$ gas: 5 sccm $H_2$ gas (dilute gas) : 100 sccm Substrate temperature: 300° C.

RF power: 10 W

Pressure: 100 mTorr

In this way, the high purity silicon layer 82 comprising polycrystalline silicon is formed on the substrate 81.

Figure 14B:
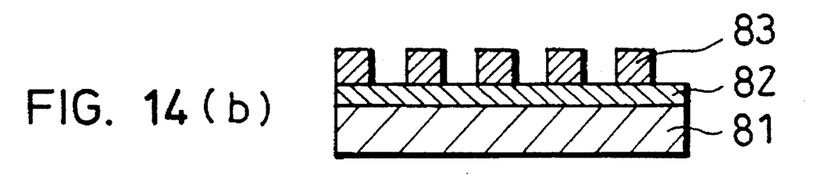

In the next process, shown in FIG. 14b, on the surface of high purity silicon layer 82, $n^+$-type a-Si layer 83 with 500 Å thickness is formed by plasma CVD, a known, conventional method. This silicon layer 83 is patterned like islands (See FIG. 15).

In this embodiment, the $n^+$-type a-Si layer 83 is needed to pick up photogenerated carrier to outside. Therefore, this silicon layer 83 is doped by high concentration impurities to decrease its resistance.

Figure 14C:
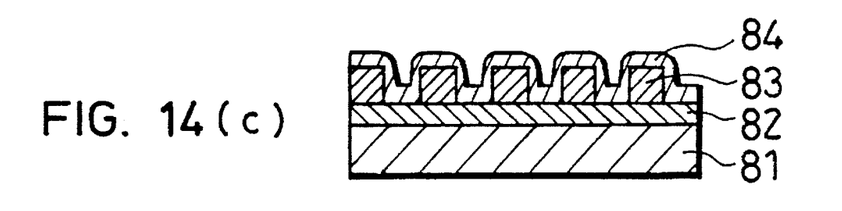

In the process shown in FIG. 14c, a $p^+$-type a-Si layer 84 with 500 Å thickness is formed to cover the $n^+$-type a-Si silicon layer 83 patterned like islands. This $p^+$-type a-Si silicon layer 83 is also doped by high concentration impurities by plasma CVD, in the same way of forming the $n^+$-type a-Si layer 83.

In TABLE7, the typical conditions for forming the $p^+$-type a-Si layer 83 and the $n^+$-type a-Si layer are described.

TABLE 7

| | reaction gas | | substrate temperature | pressure |
|---|---|---|---|---|
| the n type amorphous silicon | $SiH_4$ $PH_3/H_2$ (0.1%) | 30 sccm 50 sccm | 200° C. | 0.5 Torr |
| the p type amorphous silicon | $SiH_4$ $B_2H_6/H_2$ (0.1%) | 30 sccm 50 sccm | 200° C. | 0.5 Torr |

As shown in TABLE7, the forming temperatures of the $n^+$-type a-Si layer 83 and the $p^+$-type a-Si layer 84 are lower than that of the high purity silicon layer 82, because the above mentioned high purity silicon layer 82 has already been formed. The reason the forming temperature for the $n^+$-type or $p^+$-type a-Si layer is set lower than that of the high purity silicon layer 82 is based on the following:

If the forming temperature for the $n^+$-type or $p^+$-type a-Si layer is higher than that of the high purity silicon layer 82, the impurities in the low purity silicon substrate will diffuse into the high purity silicon layer 82.

Figure 14D:
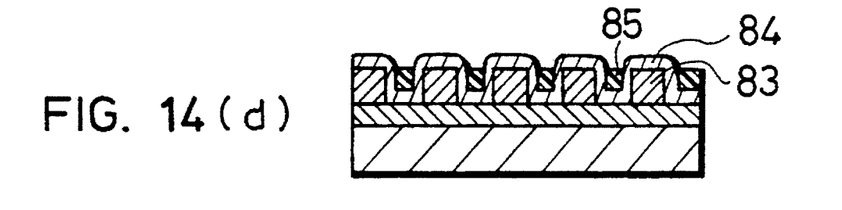

In the stage shown in FIG. 14d, the resist 85 is patterned to leave resist 85 between a number of regions of $n^+$-type a-Si layer 83 patterned like islands.

Figure 14E:
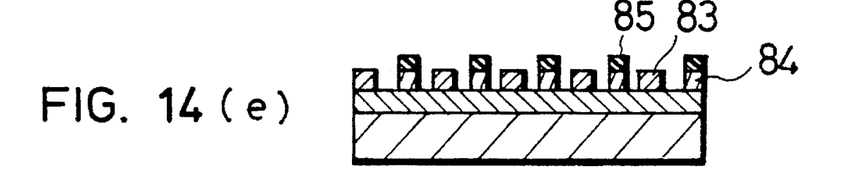

In the process shown in FIG. 14e, the $p^+$-type a-Si layer is etched and removed under the mask of the resist 85. In this case, since the etching process exposes the $n^+$-type a-Si layer 83, the selective etching between the $p^+$-type a-Si layer 84 and the $n^+$-type a-Si layer 83 is controlled by the etching time.

Figure 14F:
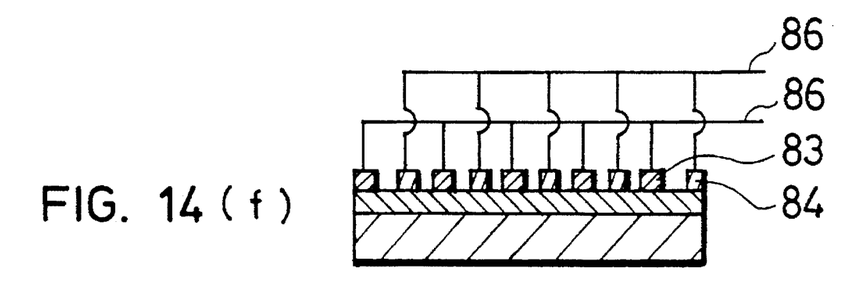

In the process shown in FIG. 14e, after removing the resist 85, electrical connections are carried out. These electrical connections 86 are shown in FIG. 14f illustratively.

Figure 15:
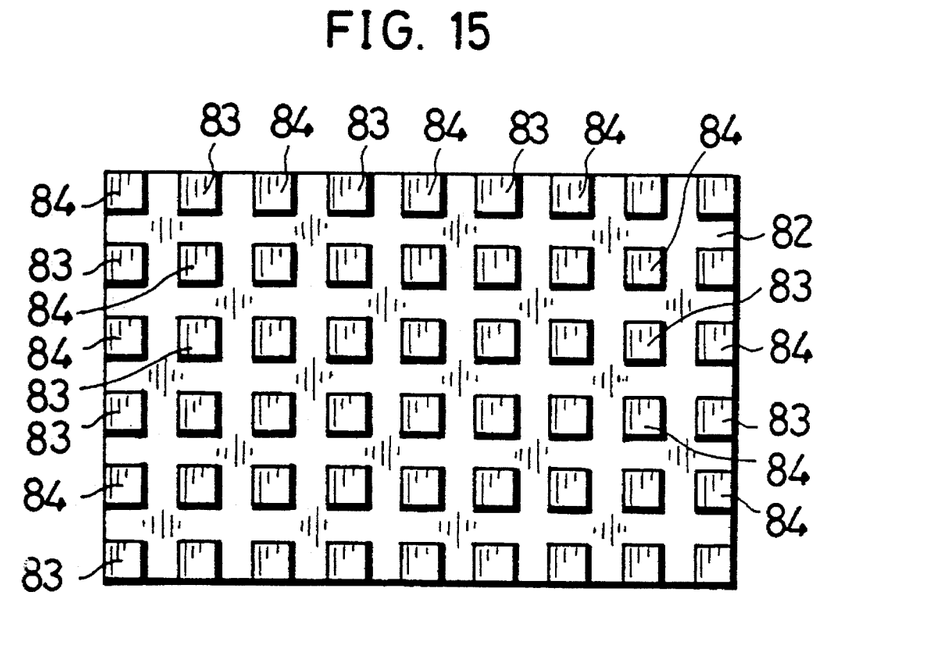
FIG. 15 is a top plan view of an a-Si pattern for a photovoltaic device manufactured in accordance with the eighth embodiment.

The view of the pattern from the formed side of the a-Si for the device is shown in FIG. 15. The reference numerals in FIG. 15 correspond to those in FIG. 14.

According to FIG. 15, in this device, electrical contacts and leads of the $n^+$-type a-Si layer 83 and the $p^+$-type a-Si layer 84 are taken out from each surface of the a-Si layers, what is called point contact.

In this photovoltaic device, a semiconductor junction is constructed between the $p^+$-type a-Si layer 84 and high purity silicon layer 82, and also between $n^+$-type a-Si layer 83 and high purity silicon layer 82. This high purity silicon layer 82 acts as the active layer.

Therefore, in this eighth embodiment, on the surface of the high purity silicon layer 82, short wavelength light can be absorbed effectively.

NINTH EMBODIMENT

Figure 16:
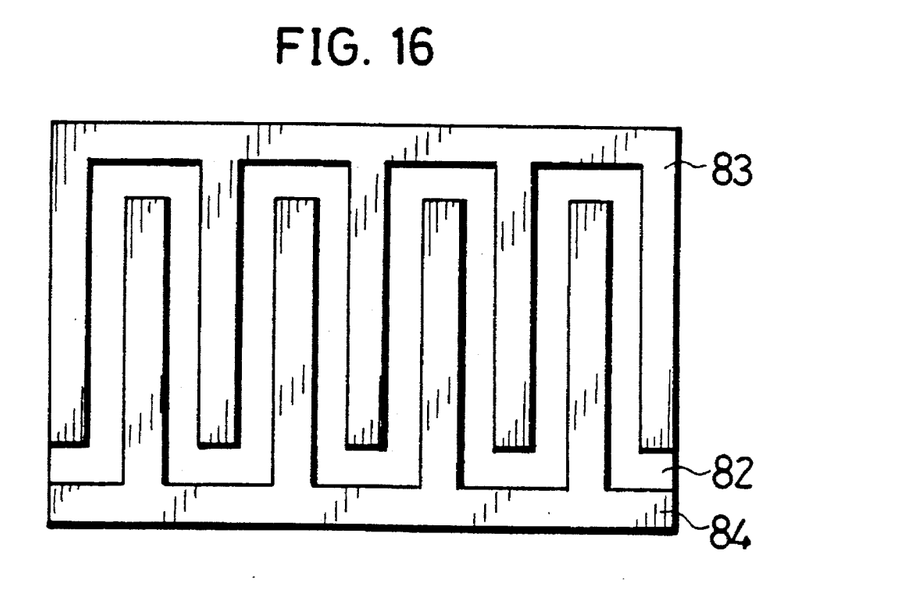
FIG. 16 is a top plan view of an a-Si pattern for a photovoltaic device manufactured in accordance with a ninth embodiment of the invention.

In this embodiment, a device whose patterns of the $n^+$-type and $p^+$-type a-Si layer are formed interdigitately is described. FIG. 16 is an illustration of the a-Si pattern of the photovoltaic device manufactured in accordance with the ninth embodiment. Since the patterns of a-Si layers are formed interdigitately in this photovoltaic device, it is easy to form electrical contacts. The reference numerals in FIG. 16 correspond to those in FIG. 14.

In the eighth and ninth embodiments, high purity silicon layers are formed by epitaxial growth; however, in the method of the second embodiment, hydrogen treatment under high temperature and high pressure is also available.

According to the photovoltaic device of the eighth and ninth embodiments, most photogenerated carriers are generated within the high purity silicon layer. The carrier can be taken out effectively from the $p^+$-type a-Si layer and the $n^+$-type a-Si layer formed onto above high purity silicon layer. Therefore, although low purity silicon is used as the substrate, a high conversion efficiency can be obtained.

Additionally, in the photovoltaic device of the eighth and ninth embodiments, high purity silicon layers formed on the low purity silicon substrate are used as active layers so that the amount of expensive materials can be substantially reduced to provide low cost of photovoltaic devices.

Further, setting the forming temperature for the conductive a-Si layer lower than that of the high purity silicon layer, during the manufacturing process, the impurities in the low purity silicon substrate do not diffuse into the high purity silicon layer 82. As a result, the photovoltaic devices with superior characteristics are obtained.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A semiconductor device comprising silicon and having:
   a substrate composed of metallurgical grade silicon having a silicon purity level,
   a silicon layer formed on said substrate, having a silicon purity level which exceeds 99.999% and is higher than the silicon purity level of said metallurgical grade silicon, and an electrode formed on said silicon layer.

2. A semiconductor device as defined in claim 1 wherein the silicon purity level of said metallurgical grade silicon is less than 99.99%.

3. A semiconductor device comprising silicon and having:

a substrate selected from the group of metallurgical grade silicon and silicon whose purity is less than 99.99%, a silicon layer whose silicon purity is over 99.999% formed on said substrate, and an electrode formed on said silicon layer.

4. A photovoltaic device comprising silicon and having:

an active silicon layer having a purity level formed on a substrate composed of metallurgical grade silicon having a purity level which is comparatively lower than that of said active silicon layer, a first conductive type of a-Si formed on a first portion of said active silicon layer, and a second conductive type a-Si formed on a second portion of said active silicon layer, wherein said first portion and said second portion are non-contiguous.

5. A semiconductor device as defined in claim 4 wherein said substrate is selected from the group of metallurgical grade silicon and silicon whose purity is less than 99.99%.

6. A semiconductor device as defined in claim 4 wherein said active silicon layer has a purity exceeding 99.999%.

7. A semiconductor device as defined in claim 4 wherein said active silicon layer is semiconductor grade.

8. A photovoltaic device comprising:

a substrate composed of a metallurgical grade silicon material and having a silicon purity level;

an active silicon layer having a silicon purity level, wherein said active silicon layer purity level is higher than said substrate silicon purity level, said active silicon layer formed on said substrate;

one conductive type of a-Si formed on one portion of said active silicon layer, and another conductive type of a-Si formed on another portion of said active silicon layer, wherein said another portion is spaced from said one portion.

9. A device as defined in claim 8 wherein said substrate is composed of silicon whose purity is less than 99.99%.

10. A device as defined in claim 8 wherein said active silicon layer has a purity exceeding 99.999%.

11. A device as defined in claim 8 wherein said one conductive type of a-Si is spaced from said another conductive type of a-Si by a portion of said active silicon layer.

* * * * *